(12) United States Patent
Grebs et al.

(10) Patent No.: US 8,026,558 B2
(45) Date of Patent: Sep. 27, 2011

(54) SEMICONDUCTOR POWER DEVICE HAVING A TOP-SIDE DRAIN USING A SINKER TRENCH

(75) Inventors: Thomas E. Grebs, Mountaintop, PA (US); Gary M. Dolny, Mountaintop, PA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/794,936

(22) Filed: Jun. 7, 2010

(65) Prior Publication Data

US 2010/0237415 A1    Sep. 23, 2010

Related U.S. Application Data

(60) Division of application No. 12/038,184, filed on Feb. 27, 2008, now Pat. No. 7,732,876, which is a continuation of application No. 11/194,060, filed on Jul. 28, 2005, now Pat. No. 7,352,036.

(60) Provisional application No. 60/598,678, filed on Aug. 3, 2004.

(51) Int. Cl.
*H01L 31/113* (2006.01)
*H01L 21/332* (2006.01)

(52) U.S. Cl. ........ 257/401; 257/332; 257/333; 438/238; 438/183

(58) Field of Classification Search .......... 257/330–333, 257/401; 438/135–138, 173, 243, 268–20
See application file for complete search history.

(56) References Cited

U.S. PATENT DOCUMENTS

| | | | |
|---|---|---|---|
| 3,404,295 A | 10/1968 | Warner, Jr. |
| 3,412,297 A | 11/1968 | Amlinger |
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,011,105 A | 3/1977 | Paivinen et al. |
| 4,300,150 A | 11/1981 | Colak |

(Continued)

FOREIGN PATENT DOCUMENTS

CN    1036666 A    10/1989

(Continued)

OTHER PUBLICATIONS

Andreini et al. A New Integrated Silicon Gate Technology Combining Bipolar Linear, CMOS Logic, and DMOS Power Parts, IEEE Transactions on Electron Devices, Dec. 1986, pp. 2025-2030, vol. ED-33.

(Continued)

*Primary Examiner* — Dung A. Le
(74) *Attorney, Agent, or Firm* — Kilpatrick Townsend & Stockton LLP

(57) ABSTRACT

A semiconductor power device includes a plurality of groups of stripe-shaped trenches extending in a silicon region over a substrate, and a contiguous sinker trench completely surrounding each group of the plurality of stripe-shaped trenches so as to isolate the plurality of groups of stripe-shaped trenches from one another. The contiguous sinker trench extends from a top surface of the silicon region through the silicon region and terminates within the substrate. The contiguous sinker trench is lined with an insulator only along the sinker trench sidewalls so that a conductive material filling the contiguous sinker trench makes electrical contact with the substrate along the bottom of the contiguous sinker trench and makes electrical contact with an interconnect layer along the top of the contiguous sinker trench.

12 Claims, 3 Drawing Sheets

U.S. PATENT DOCUMENTS

| | | |
|---|---|---|
| 4,324,038 A | 4/1982 | Chang et al. |
| 4,326,332 A | 4/1982 | Kenney |
| 4,337,474 A | 6/1982 | Yukimoto |
| 4,338,616 A | 7/1982 | Bol |
| 4,345,265 A | 8/1982 | Blanchard |
| 4,445,202 A | 4/1984 | Geotze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,694,313 A | 9/1987 | Beasom |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,990,463 A | 2/1991 | Mori |
| 4,992,390 A | 2/1991 | Chang |
| 5,023,196 A | 6/1991 | Johnsen et al. |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Bulucea et al. |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwamatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,270,257 A | 12/1993 | Shin |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,283,452 A | 2/1994 | Shih et al. |
| 5,294,824 A | 3/1994 | Okada |
| 5,298,761 A | 3/1994 | Aoki et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,349,224 A | 9/1994 | Gilbert et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,378,655 A | 1/1995 | Hutchings et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,060 A | 12/1996 | Hertrich et al. |
| 5,583,065 A | 12/1996 | Miwa |
| 5,589,405 A | 12/1996 | Contiero et al. |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,614,749 A | 3/1997 | Ueno |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,283 A | 7/1997 | Tsang et al. |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi |
| 5,719,409 A | 2/1998 | Singh et al. |
| 5,721,148 A | 2/1998 | Nishimura |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,082 A | 9/1998 | Tseng |
| 5,801,417 A | 9/1998 | Tsang et al. |
| 5,814,858 A | 9/1998 | Williams |
| 5,821,583 A | 10/1998 | Hshieh et al. |
| 5,877,528 A | 3/1999 | So |
| 5,879,971 A | 3/1999 | Witek |
| 5,879,994 A | 3/1999 | Kwan et al. |
| 5,891,776 A | 4/1999 | Han et al. |
| 5,894,157 A | 4/1999 | Han et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,907,776 A | 5/1999 | Hshieh et al. |
| 5,917,216 A | 6/1999 | Floyd et al. |
| 5,929,481 A | 7/1999 | Hshieh et al. |

| Patent No. | Date | Inventor |
|---|---|---|
| 5,943,581 A | 8/1999 | Lu et al. |
| 5,945,708 A | 8/1999 | Tihanyi |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,960,311 A | 9/1999 | Singh et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,977,591 A | 11/1999 | Fratin et al. |
| 5,981,344 A | 11/1999 | Hshieh et al. |
| 5,981,354 A | 11/1999 | Spikes et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,008,520 A | 12/1999 | Darwish et al. |
| 6,011,298 A | 1/2000 | Blanchard |
| 6,015,727 A | 1/2000 | Wanlass |
| 6,020,250 A | 2/2000 | Kenney |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,037,633 A | 3/2000 | Shinohara |
| 6,040,600 A | 3/2000 | Uenishi et al. |
| 6,048,772 A | 4/2000 | D'Anna |
| 6,049,108 A | 4/2000 | Williams et al. |
| 6,051,488 A | 4/2000 | Lee et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |
| 6,072,215 A | 6/2000 | Kawaji et al. |
| 6,077,733 A | 6/2000 | Chen et al. |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,103,619 A | 8/2000 | Lai |
| 6,104,054 A | 8/2000 | Corsi et al. |
| 6,110,799 A | 8/2000 | Huang |
| 6,114,727 A | 9/2000 | Ogura et al. |
| 6,121,089 A | 9/2000 | Zeng et al. |
| 6,133,634 A | 10/2000 | Joshi |
| 6,137,152 A | 10/2000 | Wu |
| 6,140,678 A | 10/2000 | Grabowski et al. |
| 6,150,697 A | 11/2000 | Teshigahara et al. |
| 6,156,606 A | 12/2000 | Michaelis |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,769 B1 | 1/2001 | Lou |
| 6,174,773 B1 | 1/2001 | Fujishima |
| 6,174,785 B1 | 1/2001 | Parekh et al. |
| 6,184,092 B1 | 2/2001 | Tseng et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,194,741 B1 | 2/2001 | Kinzer et al. |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,229 B1 | 4/2001 | Hebert et al. |
| 6,222,233 B1 | 4/2001 | D'Anna |
| 6,225,649 B1 | 5/2001 | Minato |
| 6,228,727 B1 | 5/2001 | Lim et al. |
| 6,229,194 B1 | 5/2001 | Lizotte |
| 6,239,463 B1 | 5/2001 | Williams et al. |
| 6,239,464 B1 | 5/2001 | Tsuchitani et al. |
| 6,246,090 B1 | 6/2001 | Brush et al. |
| 6,262,453 B1 | 7/2001 | Hshieh |
| 6,265,269 B1 | 7/2001 | Chen et al. |
| 6,271,082 B1 | 8/2001 | Hou et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,437 B1 | 8/2001 | Evans |
| 6,274,904 B1 | 8/2001 | Tihanyi |
| 6,274,905 B1 | 8/2001 | Mo |
| 6,277,706 B1 | 8/2001 | Ishikawa |
| 6,281,547 B1 | 8/2001 | So et al. |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 6,309,920 B1 | 10/2001 | Laska et al. |
| 6,313,482 B1 | 11/2001 | Baliga |
| 6,316,806 B1 | 11/2001 | Mo |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,351,018 B1 | 2/2002 | Sapp |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,373,097 B1 | 4/2002 | Werner |
| 6,373,098 B1 | 4/2002 | Brush et al. |
| 6,373,100 B1 | 4/2002 | Pages et al. |
| 6,376,314 B1 | 4/2002 | Jerred |
| 6,376,315 B1 | 4/2002 | Hshieh et al. |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,392,290 B1 | 5/2002 | Kasem et al. |
| 6,396,102 B1 | 5/2002 | Calafut |
| 6,400,003 B1 | 6/2002 | Huang |
| 6,413,822 B2 | 7/2002 | Williams et al. |
| 6,426,260 B1 | 7/2002 | Hshieh |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,437,399 B1 | 8/2002 | Huang |
| 6,441,454 B2 | 8/2002 | Hijzen et al. |
| 6,444,527 B1 | 9/2002 | Floyd et al. |
| 6,444,574 B1 | 9/2002 | Chu |
| 6,452,230 B1 | 9/2002 | Boden, Jr. |
| 6,455,379 B2 | 9/2002 | Brush et al. |
| 6,459,122 B2 | 10/2002 | Uno |
| 6,461,918 B1 | 10/2002 | Calafut |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,509,240 B2 | 1/2003 | Ren et al. |
| 6,518,127 B2 | 2/2003 | Hshieh et al. |
| 6,521,497 B2 | 2/2003 | Mo |
| 6,534,825 B2 | 3/2003 | Calafut |

| | | | |
|---|---|---|---|
| 6,566,804 B1 | 5/2003 | Trujillo et al. | |
| 6,580,123 B2 | 6/2003 | Thapar | |
| 6,583,010 B2 | 6/2003 | Mo | |
| 6,600,194 B2 | 7/2003 | Hueting et al. | |
| 6,608,350 B2 | 8/2003 | Kinzer et al. | |
| 6,621,107 B2 | 9/2003 | Blanchard et al. | |
| 6,627,949 B2 | 9/2003 | Blanchard | |
| 6,635,534 B2 | 10/2003 | Madson | |
| 6,649,459 B2 | 11/2003 | Deboy et al. | |
| 6,653,740 B2 | 11/2003 | Kinzer et al. | |
| 6,657,254 B2 | 12/2003 | Hshieh et al. | |
| 6,677,641 B2 | 1/2004 | Kocon | |
| 6,677,643 B2 | 1/2004 | Iwamoto et al. | |
| 6,683,346 B2 | 1/2004 | Zeng | |
| 6,689,662 B2 | 2/2004 | Blanchard | |
| 6,710,402 B2 | 3/2004 | Harada | |
| 6,710,406 B2 | 3/2004 | Mo et al. | |
| 6,713,813 B2 | 3/2004 | Marchant | |
| 6,720,616 B2 | 4/2004 | Hirler et al. | |
| 6,724,042 B2 | 4/2004 | Onishi et al. | |
| 6,734,066 B2 | 5/2004 | Lin et al. | |
| 6,750,508 B2 | 6/2004 | Omura et al. | |
| 6,756,636 B2 | 6/2004 | Onishi et al. | |
| 6,762,127 B2 | 7/2004 | Boiteux et al. | |
| 6,781,195 B2 | 8/2004 | Wu et al. | |
| 6,806,533 B2 | 10/2004 | Henninger et al. | |
| 6,818,482 B1 | 11/2004 | Horch et al. | |
| 6,818,513 B2 | 11/2004 | Marchant | |
| 6,821,824 B2 | 11/2004 | Minato et al. | |
| 6,833,584 B2 | 12/2004 | Henninger et al. | |
| 6,833,585 B2 | 12/2004 | Kim et al. | |
| 6,878,994 B2 | 4/2005 | Thapar | |
| 6,892,098 B2 | 5/2005 | Ayal et al. | |
| 6,921,939 B2 | 7/2005 | Zeng | |
| 7,005,351 B2 | 2/2006 | Henninger et al. | |
| 7,033,876 B2 | 4/2006 | Darwish et al. | |
| 7,091,573 B2 | 8/2006 | Hirler et al. | |
| 7,345,342 B2 | 3/2008 | Challa et al. | |
| 7,352,036 B2 | 4/2008 | Grebs et al. | |
| 2001/0020720 A1 | 9/2001 | Hueting et al. | |
| 2002/0038886 A1 | 4/2002 | Mo | |
| 2003/0060013 A1 | 3/2003 | Marchant et al. | |
| 2003/0062622 A1 | 4/2003 | Pavier et al. | |
| 2003/0235936 A1 | 12/2003 | Snyder et al. | |
| 2004/0108554 A1 | 6/2004 | Hshieh et al. | |
| 2004/0232407 A1 | 11/2004 | Calafut | |
| 2005/0017293 A1 | 1/2005 | Zundel et al. | |
| 2008/0142883 A1 | 6/2008 | Grebs et al. | |

FOREIGN PATENT DOCUMENTS

| | | |
|---|---|---|
| DE | 4300806 C1 | 12/1993 |
| DE | 19736981 A1 | 8/1998 |
| DE | 10214160 A1 | 10/2003 |
| DE | 102004057235 A1 | 6/2006 |
| EP | 133642 A1 | 6/1985 |
| EP | 288739 A2 | 2/1988 |
| EP | 292782 A2 | 11/1988 |
| EP | 747967 A2 | 12/1996 |
| EP | 975024 A2 | 1/2000 |
| EP | 1026749 A1 | 8/2000 |
| EP | 1054451 A2 | 11/2000 |
| EP | 1205980 A1 | 5/2002 |
| JP | 56-058267 A | 5/1981 |
| JP | 62-069562 A | 3/1987 |
| JP | 63-186475 A | 8/1988 |
| JP | 63-288047 A | 11/1988 |
| JP | 64-022051 A | 1/1989 |
| JP | 01-192174 A | 8/1989 |
| JP | 05-226638 A | 9/1993 |
| JP | 2000-040822 A | 2/2000 |
| JP | 2000-040872 A | 2/2000 |
| JP | 2000-156978 A | 6/2000 |
| JP | 2000-277726 A | 10/2000 |
| JP | 2000-277728 A | 10/2000 |
| JP | 2001-015448 A | 1/2001 |
| JP | 2001-015752 A | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 12/2001 |
| JP | 2002-083976 A | 3/2002 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 A2 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/47171 A1 | 6/2002 |
| WO | WO 2006/017376 A2 | 2/2006 |

OTHER PUBLICATIONS

Bai et al., "Novel automated optimization of power MOSFET for 12V input, high-frequency DC-DC converter," *International Symposium on Power Semiconductors and ICs, Technical Digest*, 2003, pp. 366-369.

Baliga "New Concepts in Power Rectifiers," Physics of Semiconductor Devices, Proceedings of the Third Int'l Workshop, Madras (India), Committee on Science and Technology in Developing Countries, 1985, pp. 471-481.

Baliga "Options for CVD of Dielectrics Include Low-k Materials," Technical Literature from Semiconductor International, Jun. 1998, 4 pages.

Baliga et al., "Improving the reverse recovery of power MOSFET integral diodes by electron irradiation," Solid State Electronics, Dec. 1983, pp. 1133-1141, vol. 26, No. 12.

Brown et al. Novel Trench Gate Structure Developments Set the Benchmark for Next Generation Power MOSFET Switching Performance. Power Electronics—May 2003 Proceedings (PCIM), Nurenburg, 2003, pp. 275-278, vol. 47.

Bulucea "Trench DMOS Transistor Technology for High Current (100 A Range) Switching" Solid-State Electronics, 1991, pp. 493-507, vol. 34.

Chang et al. "Self-Aligned UMOSFET's with a Specific On-Resistance of 1mΩ cm2," IEEE Transactions on Electron Devices, 1987, pp. 2329-2334, vol. 34.

Cheng et al., "Fast reverse recovery body diode in high-voltage VDMOSFET using cell-distributed schottky contacts," IEEE Transactions on Electron Devices, May 2003, pp. 1422-1425, vol. 50, No. 5.

Curtis, et al. "APCVD TEOS: 03 Advanced Trench Isolation Applications," Semiconductor Fabtech 9th Edition,1999, 8 pages.

"CoolMOSä the second generation," Infineon Technologies product information, 2000, 2 pages.

Darwish et al. A New Power W-Gated Trench MOSFET (WMOSFET) with High Switching Performance. ISPSD Proceedings—Apr. 14-17, 2003, 4 pages, Cambridge.

Djekic, O. et al., "High frequency synchronous buck converter for low voltage applications," Proc. IEEE Power Electronics Specialist Conf. (PESC),1998, pp. 1248-1254.

Fujihira "Theory of Semiconductor Superjunction Devices" Jpn. J. Appl. Phys. Oct. 1997, pp. 6254-6262, vol. 36.

Gan et al. "Poly Flanked VDMOS (PFVDMOS): A Superior Technology for Superjunction Devices," IEEE Power Electronics Specialists Conference, Jun. 17-22, 2001, Vancouver, Canada, 2001, pp. 2156-2159.

Glenn et al. "A Novel Vertical Deep Trench RESURF DMOS (VTR-DMOS)" IEEE ISPD 2000, May 22-25, pp. 197-200, Toulouse France.

Heyes, "Wafer-Scale Packaging for Power Discrete Products" Philips Semiconductors BI Power Products, 3 pages.

"IR develops CoolMOSä -equivalent technology, positions it at the top of a 3-tiered line of new products for SMPS," International Rectifiers company information, 1999, 3 pages, printed on Dec. 4, 2008 at URL: http://www.irf.com.

Kao et al. "Two Dimensional Thermal Oxidation of Silicon-II. Modeling Stress Effects in Wet Oxides," IEEE Transactions on Electron Devices, vol. ED-35, No. 1, Jan. 1988, pp. 25-37.
Kao et al. "Two Dimensional Thermal Oxidation of Silicon-I. Experiments,", IEEE Transactions on Electron Devices, May 1987, pp. 1008-1017, vol. ED-34, No. 5.
Kassakian, J.G. et al., "High-frequency high-density converters for distributed power supply systems," Proceedings of the IEEE, Apr. 1988, pp. 362-376, vol. 76, No. 4.
Korman, C.S. et al., "High performance power DMOSFET with integrated schottky diode," Proc. IEEE Power Electronics Specialist Conf. (PESC), 1989, pp. 176-179.
Lorenz et al., "Cool MOS—An important milestone towards a new power MOSFET generation" Power Conversion, 1988, pp. 151-160.
Maksimovic, A.M. et al., "Modeling and simulation of power electronic converters," Proceedings of the IEEE, Jun. 2001, pp. 898-912, vol. 89, No. 6.
Mehrotra, M. et al., "Very low forward drop JBS rectifiers fabricated using submicron technology," IEEE Transactions on Electron Devices, Nov. 1993, pp. 2131-2132, vol. 40, No. 11.
Miller, "Power Management & Supply—Market, Applications Technologies—an Overview," Infineon Technologies, downloaded from the internet <<http://www.ewh.ieee.org/r8/germany/ias-pels/m_regensburg/overview_miller.pdf>>, May 5, 2003, 53 pages total.
Mirchandani et al. A Novel N-Channel MOSFET Featuring an Integrated Schottky and No Internal P-N Junction Power Semiconductor Devices and ICs, 2004. Proceedings. ISPSD'04. The 16th International Symposium on May 24-27, 2004, pp. 405-408.
Moghadam "Delivering Value Around New Industry Paradigms," Technical Literature from Applied Materials, Nov. 1999, 15 pages, vol. 1, issue 2.
Park et al., "Lateral Trench Gate Super-Junction SOI-LDMOSFETs with Low On-Resistance," Institute for Microelectronics, University of Technology Vienna, Austria, 2002, pp. 283-286.
Sakai et al., "Experimental investigation of dependence of electrical characteristics of device parameters in trench MOS barrier, schottky diodes," International Symposium on Power Semiconductors and ICs, Technical Digest, 1998, pp. 293-296.
Shenai et al., "Current transport mechanisms in atomically abrupt metal-semiconductor interfaces," IEEE Transactions on Electron Devices, Apr. 1988, pp. 468-482, vol. 35, No. 4.
Shenai et al., "Monolithically integrated power MOSFET and schottky diode with improved reverse recovery characteristics," IEEE Transactions on Electron Devices, Apr. 1990, pp. 1167-1169, vol. 37, No. 4.
Shenoy et al."Analysis of the Effect of Charge Imbalance on the Static and Dynamic Characteristic of the Super Junction MOSFET," IEEE International Symposium on Power Semiconductor Devices 1999, pp. 99-102.
Singer "Empty Spaces in Silicon (ESS): An Alternative to SOI," Semiconductor International, Dec. 1999, p. 42.
Tabisz et al., "A MOSFET resonant synchronous rectifier for high-frequency dc/dc converters," Proc. IEEE Power Electronics Specialist Conf. (PESC), 1990, pp. 769-779.
Technical Literature from Quester Technology, Model APT-4300 300mm Atmospheric TEOS/Ozone CVD System, 2 pages.
Technical Literature from Quester Technology, Model APT-6000 Atmospheric TEOS-Ozone CVD System, 4 pages.
Technical Literature from Silicon Valley Group Thermal Systems, APNext: The Next Generation of APCVD Products, 2 pages total.
Tu et al. "On the reverse blocking characteristics of schottky power diodes," IEEE Transactions on Electron Devices, Dec. 1992, pp. 2813-2814, vol. 39, No. 12.
Ueda et al. "An Ultra-Low On-Resistance Power MOSFET Fabricated by Using a Fully Self-Aligned Process," IEEE Transactions on Electron Devices, 1987, pp. 926-930, vol. 34.
Wilamowski "Schottky Diodes with High Breakdown Voltages," Solid-State Electronics, 1983, pp. 491-493, vol. 26.
Wolf et al., "Silicon Processing for The VLSI Era" vol. 1—Process Technology, Second Edition, 1990, p. 658.
Wolf, "Silicon Processing for The VLSI Era" vol. 2 Process Integration Lattice Press,1990, 3 pages.
Yamashita et al., Conduction Power loss in MOSFET synchronous rectifier with parallel-connected schottky barrier diode, IEEE Transactions on Power electronics, Jul. 1998, pp. 667-673, vol. 13, No. 4.
Zeng "An Improved Power MOSFET Using a Novel Split Well Structure". Harris Corporation, Semiconductor Section, Technical Publication, 1999, 4 pages.
Zeng et al. An Ultra Dense Trench-Gated Power MOSFET Technology Using a Self-Aligned Process, Intersil Corporation, Technical Publication, 2001, pp. 147-150.
Andreini et al. A New Integrated Silicon Gate Technology Combining Bipolar Linear, CMOS Logic, and DMOS Power Parts, IEEE Transactions on Electron Devices, Dec. 1986, pp. 2025-2030, vol. ED-33.
Requirement for Restriction/Election for U.S. Appl. No. 11/194,060, mailed on Nov. 13, 2006, 5 pages.
Requirement for Restriction/Election for U.S. Appl. No. 11/194,060, mailed on Jan. 30, 2007, 6 pages.
Notice of Allowance for U.S. Appl. No. 11/194,060, mailed on Apr. 10, 2007, 9 pages.
Notice of Allowance for U.S. Appl. No. 11/194,060, mailed on Jul. 27, 2007, 22 pages.
Notice of Allowance for U.S. Appl. No. 11/194,060, mailed on Oct. 19, 2007, 6 pages.
Notice of Allowance for U.S. Appl. No. 12/038,184, mailed on Dec. 4, 2009, 29 pages.
International Search Report on Patentability for Application No. PCT/US2005/026928, mailed on Jun. 20, 2007, 1 page.
Written Opinion of the International Searching Authority for Application No. PCT/US2005/026928, mailed on Jun. 20, 2007, 3 pages.
International Preliminary Report on Patentability for Application No. PCT/US2005/026928, mailed on Jul. 10, 2007, 4 pages.
Office Action for Application No. A 9304/2005, mailed on Jul. 17, 2008, 3 pages.
Office Action for Application No. CN 200580024408.1, mailed on Aug. 1, 2008, 5 pages.
Notice of Preliminary Rejection for Application No. KR 10-2007-7005115, mailed Dec. 24, 2007, 19 pages including English Translation.
Notice of Allowance for Application No. KR 10-2007-7005115, mailed on Apr. 24, 2008, 3 pages.

SEMICONDUCTOR POWER DEVICE HAVING A TOP-SIDE DRAIN USING A SINKER TRENCH

CROSS-REFERENCES TO RELATED APPLICATIONS

This application is a divisional of U.S. application Ser. No. 12/038,184, filed Feb. 27, 2008, which is a continuation of U.S. application Ser. No. 11/194,060, filed Jul. 28, 2005, now U.S. Pat. No. 7,352,036, which claims the benefit of U.S. Provisional Application No. 60/598,678, filed Aug. 3, 2004. All are incorporated herein by reference in their entirety for all purposes. Also, this application relates to application Ser. No. 11/026,276 titled "Power Semiconductor Devices and Methods of Manufacture" filed Dec. 29, 2004, which is incorporated herein by reference.

BACKGROUND OF THE INVENTION

This invention relates in general to semiconductor power devices and more particularly to power devices with top-side drain contact using a sinker trench.

Unlike integrated circuits (ICs) which have a lateral structure with all interconnects available on the upper die surface, many power semiconductor devices have a vertical structure with the back of the die being an active electrical connection. For example, in vertical power MOSFET structures, the source and gate connections are at the top surface of the die and the drain connection is on the back side of the die. For some applications, it is desirable to make the drain connection accessible at the top side. Sinker trench structures are used for this purpose.

In a first technique, diffusion sinkers extending from the top-side of the die down to the substrate (which forms the drain contact region of the device) are used to make the drain contact available at the top surface of the die. A drawback of this technique is that the lateral diffusion during the formation of the diffusion sinkers results in consumption of a significant amount of the silicon area.

In a second technique, metal-filled vias extending from the top-side of the die clear through to the backside of the die are used to bring the back-side contact to the top-side of the die. Although, this technique does not suffer from the loss of active area as in the diffusion sinker technique, it however requires formation of very deep vias which adds to the complexity of the manufacturing process. Further, during conduction, the current is required to travel through long stretches of the substrate before reaching the drain contact, thus resulting in higher device on resistance Ron.

Thus, an improved trench structure for making a back-side contact available at the top-side is desirable.

BRIEF SUMMARY OF THE INVENTION

In accordance with an embodiment of the invention, a semiconductor power device includes a substrate of a first conductivity type and an epitaxial layer of the first conductivity type over and in contact with the substrate. A first trench extends into and terminates within the epitaxial layer. A sinker trench extends from the top surface of the epitaxial layer through the epitaxial layer and terminates within the substrate. The sinker trench is laterally spaced from the first trench, and is wider and extends deeper than the first trench. The sinker trench is lined with an insulator only along the sinker trench sidewalls so that a conductive material filling the sinker trench makes electrical contact with the substrate along the bottom of the trench and makes electrical contact with an interconnect layer along the top of the trench.

In accordance with another embodiment of the invention, a semiconductor power device is formed as follows. An epitaxial layer is formed over and in contact with a substrate. The epitaxial layer and the substrate are of a first conductivity type. A first opening for forming a first trench and a second opening for forming a sinker trench are defined such that the second opening is wider than the first opening. A silicon etch is performed to simultaneously etch through the first and second openings to form the first trench and the sinker trench such that the first trench terminates within the epitaxial layer and the sinker trench terminates within the substrate. The sinker trench sidewalls and bottom are lined with an insulator. The sinker trench is filled with a conductive material such that the conductive material makes electrical contact with the substrate along the bottom of the sinker trench. An interconnect layer is formed over the epitaxial layer such that the interconnect layer makes electrical contact with the conductive material along the top surface of the sinker trench.

In accordance with yet another embodiment of the invention, a semiconductor power device includes a plurality of groups of stripe-shaped trenches extending in a silicon region over a substrate. A contiguous sinker trench completely surrounds each group of the plurality of stripe-shaped trenches so as to isolate the plurality of groups of stripe-shaped trenches from one another. The contiguous sinker trench extends from a top surface of the silicon region through the silicon region and terminates within the substrate. The contiguous sinker trench is lined with an insulator only along the sinker trench sidewalls so that a conductive material filling the contiguous sinker trench makes electrical contact with the substrate along the bottom of the contiguous sinker trench and makes electrical contact with an interconnect layer along the top of the contiguous sinker trench.

In accordance with yet another embodiment of the invention, a semiconductor power device includes a plurality of groups of stripe-shaped gate trenches extending in a silicon region over a substrate. Each of a plurality of stripe-shaped sinker trenches extends between two adjacent groups of the plurality of groups of stripe-shaped gate trenches. The plurality of stripe-shaped sinker trenches extend from a top surface of the silicon region through the silicon region and terminate within the substrate. The plurality of stripe-shaped sinker trenches are lined with an insulator only along the sinker trench sidewalls so that a conductive material filling each sinker trench makes electrical contact with the substrate along the bottom of the sinker trench and makes electrical contact with an interconnect layer along the top of the sinker trench.

In accordance with another embodiment of the invention, a semiconductor package device houses a die which includes a power device. The die includes a silicon region over a substrate. Each of a first plurality of trenches extends in the silicon region. A contiguous sinker trench extends along the perimeter of the die so as to completely surround the first plurality of trenches. The contiguous sinker trench extends from a top surface of the die through the silicon region and terminates within the substrate. The contiguous sinker trench is lined with an insulator only along the sinker trench sidewalls so that a conductive material filling the contiguous sinker trench makes electrical contact with the substrate along the bottom of the contiguous sinker trench and makes electrical contact with an interconnect layer along the top of the contiguous sinker trench. A plurality of interconnect balls arranged in a grid array includes an outer group of the plurality of interconnect balls electrically connecting to the conductive material in the contiguous sinker trench.

DETAILED DESCRIPTION OF THE INVENTION

In accordance with an embodiment of the present invention, a sinker trench terminating within the silicon substrate is filled with a highly conductive material such as doped polysilicon or metallic material. The sinker trench is laterally spaced a predetermined distance from the active region wherein gate trenches are formed. The sinker trench is wider and extends deeper than the gate trenches, and is lined with an insulator only along its sidewalls. This technique eliminates the area loss due to side diffusion of the diffusion sinker approach, and results in improved on-resistance since a more conductive material is used than diffusion. Also, this technique requires a far shallower trench than that needed in the technique where a metal-filled trench extends from the top to the bottom of the die. The on-resistance is improved since the current need not travel through the entire depth of the substrate to reach the drain contact.

Figure 1:
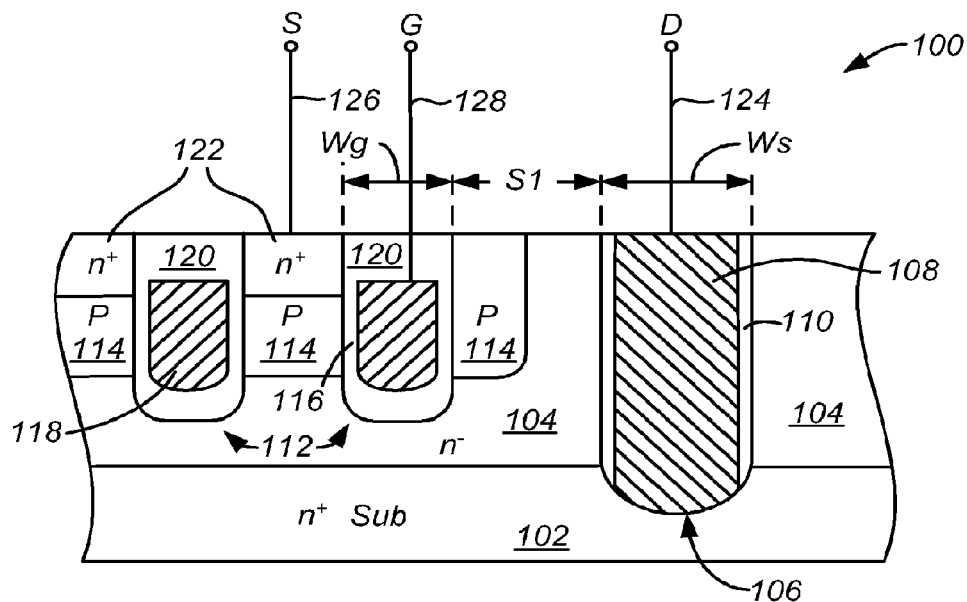
FIG. 1 shows a simplified cross sectional view of an exemplary vertical power device in accordance with an embodiment of the invention.

FIG. 1 shows a simplified cross sectional view of a vertical trenched-gate power MOSFET structure 100 in accordance with an exemplary embodiment of the invention. An n-type epitaxial layer 104 extends over an n-type substrate 102 which forms the back side drain. A sinker trench 106 extends from the top surface of epitaxial layer 104 through epitaxial layer 104 terminating within substrate 102. A dielectric layer 110 lines the sinker trench sidewalls. Dielectric layer 110 may be from any one of oxide, silicon nitride, silicon oxynitride, multilayer of oxide and nitride, any known low k insulating material, and any known high k insulating material. "Oxide" as used in this disclosure means a chemical vapor deposited oxide ($Si_xO_y$) or a thermally grown silicon dioxide ($SiO_2$). Sinker trench 106 is filled with a conductive material 108 such as doped polysilicon, selective epitaxial silicon (SEG), metal, or metallic compounds. Conductive material 108 is in electrical contact with substrate 102 along the bottom of sinker trench 106. Conductive material 108 thus makes the backside drain available along the top side for interconnection. With the drain contact moved to the top surface, a back-side metal for contacting substrate 102 is no longer needed, but could be used in conjunction with the top side contact. The back side metal layer may be included for other purposes such as preventing the die from cracking and improving the heat transfer properties of the device.

Well regions 114 of p-type conductivity extend along an upper portion of epitaxial layer 104. Gate trenches 112 are laterally spaced from sinker trench 106 by a predetermined distance S1, and vertically extend from the top surface through p-type well regions 114 terminating at a predetermined depth within epitaxial layer 104. Sinker trench 106 is wider and deeper than gate trenches 112. Gate trenches 112 are lined with a dielectric layer 116. The dielectric along the bottom of gate trenches 112 may optionally be made thicker than the dielectric along the gate trench sidewalls. Each gate trench 112 includes a gate electrode 118 and a dielectric layer 120 atop gate electrode 118 to reduce the gate to drain capacitance. Source regions 122 of n-type conductivity extend along an upper portion of well regions 114. Source regions 122 overlap gate electrodes 118 along the vertical dimension. As can be seen well region 114 terminates a distance away from sinker trench 106. In one embodiment, this distance is dictated by the device blocking voltage rating. In another embodiment, well region 114 terminates at and thus abuts sinker trench 106. In this embodiment, for higher blocking voltage ratings, the thickness of the dielectric layer along sinker trench sidewalls needs to be made larger since the sinker dielectric is required to withstand a higher voltage. This may require a wider sinker trench if the conductive material 108 is required to have a minimum width for current handling purposes.

In the on state, a conduction channel from source regions 122 to epitaxial layer 104 is formed in well regions 114 along gate trench sidewalls. A current thus flows from drain terminal 124 vertically through conductive material 108 of sinker trench 106, then laterally through substrate 102, and finally vertically through epitaxial layer 104, the conduction channel in well regions 114, and source regions 122, to source terminal 126.

While the width of the gate trenches is generally kept as small as the manufacturing technology allows to maximize the packing density, a wider sinker trench is generally more desirable. A wider sinker trench is easier to fill, has lower resistance, and can more easily be extended deeper if needed. In one embodiment, sinker trench 106 and gate trenches 114 are formed at the same time. This is advantageous in that the sinker trench is self-aligned to the active region. In this embodiment, the widths of the sinker trench and the gate trenches and spacing S1 between sinker trench 106 and the active region need to be carefully selected taking into account a number of factors. First, a ratio of width Ws of sinker trench 106 to width Wg of gate trenches 112 needs to be selected so that upon completion of the trench etch step sinker trench 106 and gate trenches 112 terminate at the desired depths. Second, the width ratio as well as spacing S1 needs to be carefully selected to minimize micro-loading effect which occurs when trenches with different features are simultaneously etched. Micro-loading effect, if not addressed properly, may cause trenches with a wide opening have a wider bottom than top. This can lead to such problems as formation of pin-holes in the conductive material in the sinker trench. The micro-loading effect can also be minimized by selecting proper etch material. Third, the widths of the trenches and spacing S1 impact the device on-resistance Ron. In the article by A. Andreini, et al., titled "A New Integrated Silicon Gate Technology Combining Bipolar Linear, CMOS Logic, and DMOS Power Parts," IEEE Transaction on Electron Devices, Vol. ED-33, No. 12, December, 1986, pp 2025-2030, a formula is set forth in section IV-B at page 2028 which can be used to determine the optimum trench widths and spacing S1 for the desired Ron. Although the power device described in this article uses a diffusion sinker, the same principles relating to optimizing Ron can be applied in the present invention. This article is incorporated herein by reference.

The ratio of the width of the sinker trench to that of the gate trenches is also dependent on the type of conductive material used in the sinker trench. In general, a ratio of the sinker trench width to the gate trench width of less than 10:1 is desirable. In one embodiment wherein doped polysilicon is used as the conductive material, a ratio of sinker trench width to gate trench width of less than 5:1 is desirable. For example, for a gate trench width of 0.5 µm, a sinker trench width in the range of about 0.7 µm to 2.5 µm would be selected. If a metal or other highly conductive material is used in the sinker trench, a higher ratio (e.g., 3:1) is more desirable. Other than the relative width of the trenches, spacing S1 between the sinker trench and the active region also impacts the micro-loading effect. A smaller spacing generally results in reduced micro-loading effect.

In one embodiment, the depth of the gate trenches in the epitaxial layer is selected to be close to the interface between substrate 102 and epitaxial layer 104 so that a slightly wider sinker trench would reach through to contact substrate 102. In an alternate embodiment, both the gate trenches and the sinker trench terminate within substrate 102.

In another embodiment, the sinker trench and the gate trenches are formed at different times. Thought the sinker trench would not be self-aligned to the active region, spacing S1 is not a critical dimension. Advantages of forming the two trenches at different times include elimination of the micro-loading effect, and the ability to optimize each trench separately.

In accordance with an embodiment of the present invention, a method of forming the power transistor shown in FIG. 1 wherein the sinker trench and gate trenches are formed simultaneously, is as follows. Epitaxial layer 104 is formed over substrate 102. Next, a masking layer is used to pattern the gate trench and sinker trench openings. Conventional plasma etch techniques are used to etch the silicon to form the sinker trench and gate trenches. An insulating layer, e.g., oxide, is then formed along sidewalls and bottom of both the gate trenches and the sinker trench. Increasing the insulating thickness or increase in the dielectric constant of the insulating material is advantageous in minimizing the area between the depletion region and sinker trench, distance S1, as some of the voltage from the depletion layer will be supported by the insulating layer thus reducing consumed silicon area by use of a sinker trench.

A nitride layer is formed over the oxide layer in all trenches. The oxide and nitride layers are then removed from the bottom of the sinker trench using conventional photolithography and anisotropic etch techniques thus leaving an oxide-nitride bi-layer along the sinker trench sidewalls. Alternatively, a combination of anisotropic and isotropic etching or isotropic etching alone can be used. The combination of anisotropic and isotropic etching can advantageously be used to respectively remove the nitride and oxide layers from lower sidewall portions of the trench sinker (e.g., those lower sidewall portions extending in the substrate or even in the epitaxial layer—this would advantageously reduce the on-resistance). The resulting thicker bi-layer of dielectric along sinker trench sidewalls is advantageously capable of withstanding higher drain voltages. The sinker trench and gate trenches are then filled with in-situ doped polysilicon. The doped polysilicon is then etched back to planarize the top of the polysilicon in the trenches with the top surface of epitaxial layer 104. Next, using a masking layer to cover the sinker trench, the polysilicon and oxide-nitride bi-layer are removed from the gate trenches. The gate trenches are then lined with a gate oxide layer and filled with gate polysilicon material. The excess gate polysilicon over the sinker trench is removed using a conventional photolithography and etch process to pattern the gate electrode. The remaining process steps for forming the insulating layer over the gate electrodes, the well regions, the source regions, the source and drain metal contact layers, as well as other steps to complete the device are carried out in accordance with conventional methods.

In an alternate method, after trenches are formed, a thick oxide layer (as mentioned above, to reduce the spacing of the sinker trench to the well region) is formed along the sidewalls and bottom of the gate and sinker trenches. The thick oxide layer is then removed from the bottom of the sinker trenches using conventional photolithography and anisotropic etch techniques thus leaving the sidewalls of the sinker trench lined with the thick oxide while the gate trenches are protected. Alternatively, a combination of anisotropic and isotropic etching can be used to also remove the thick oxide from lower portions of the trench sinker sidewalls. The oxide layer may act as a sacrificial insulating layer for the gate trenches to improve the gate oxide integrity. The sinker trench and gate trenches are then filled with in-situ doped polysilicon. The doped polysilicon is then etched back to planarize the top of the polysilicon in the trenches with the top surface of epitaxial layer 104. Next, using a masking layer to cover the sinker trench, the polysilicon and insulating layer are removed from the gate trenches. The gate trenches are then lined with a gate insulating layer and filled with gate polysilicon material. The excess gate polysilicon over the sinker trenches is removed using a conventional photolithography and etch process to pattern the gate electrode. The remaining process steps for forming the insulating layer over the gate electrodes, the well regions, the source regions, the source and drain metal contact layers, as well as other steps to complete the device are carried out in accordance with conventional methods.

In another method, once trenches are formed, an insulating layer, e.g., gate oxide, is formed (grown or deposited) along the sidewalls and bottom of the gate and sinker trenches. The gate oxide layer is then removed from the bottom of the sinker trenches using conventional photolithography and anisotropic etch techniques thus leaving an oxide layer lining the sidewalls of the sinker trench while the gate trenches are protected. Alternatively, a combination of anisotropic and isotropic etching or isotropic etching alone can be used. The combination of anisotropic and isotropic etching can advantageously be used to remove the gate oxide layer from lower sidewall portions of the trench sinker (e.g., those lower sidewall portions extending in the substrate or even in the epitaxial layer—this would advantageously reduce the on-resistance). The sinker trench and gate trenches are then filled with in-situ doped polysilicon. The doped polysilicon is then patterned using conventional photolithography techniques and etched to form both the sinker (drain) and gate electrodes. The remaining process steps for forming the insulating layer over the gate electrodes, the well regions, the source regions, the source and drain metal contact layers, as well as other steps to complete the device are carried out in accordance with conventional methods.

In yet another method, the sinker trench and gate trenches are formed independently by using separate masking steps. For example, using a first set of masks and processing steps the gate trenches are defined and etched, lined with gate oxide, and filled with polysilicon. Using a second set of masks and processing steps the sinker trench is defined and etched, lined with dielectric layer along its sidewalls, and filled with a conductive material. The order in which the sinker trench and gate trenches are formed may be reversed.

Figure 2:
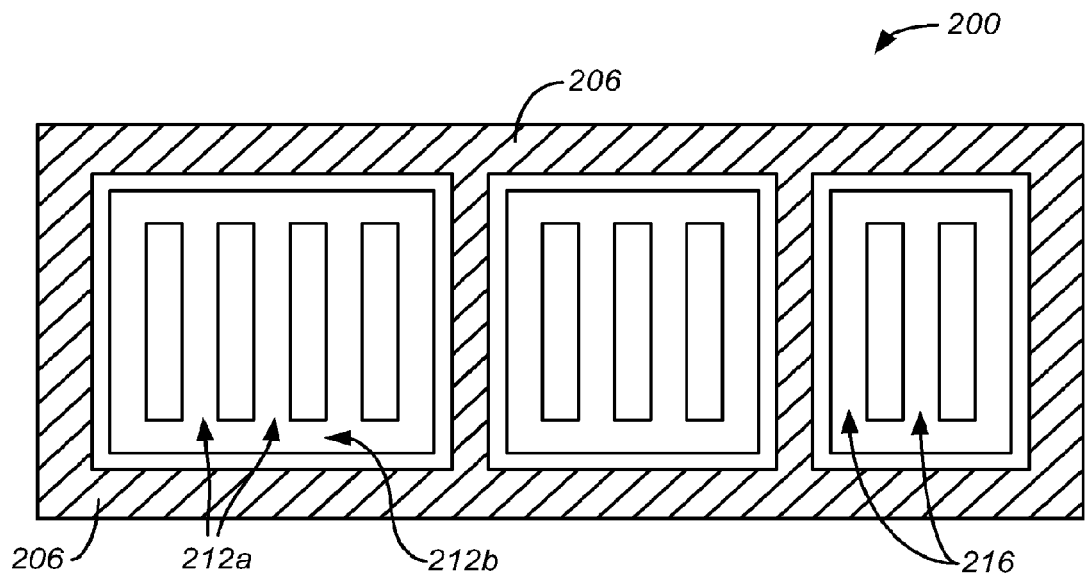
FIGS. 2-4 show various top layout views of a vertical power device with one or more sinker trenches in accordance with exemplary embodiments of the invention.
Figure 3:
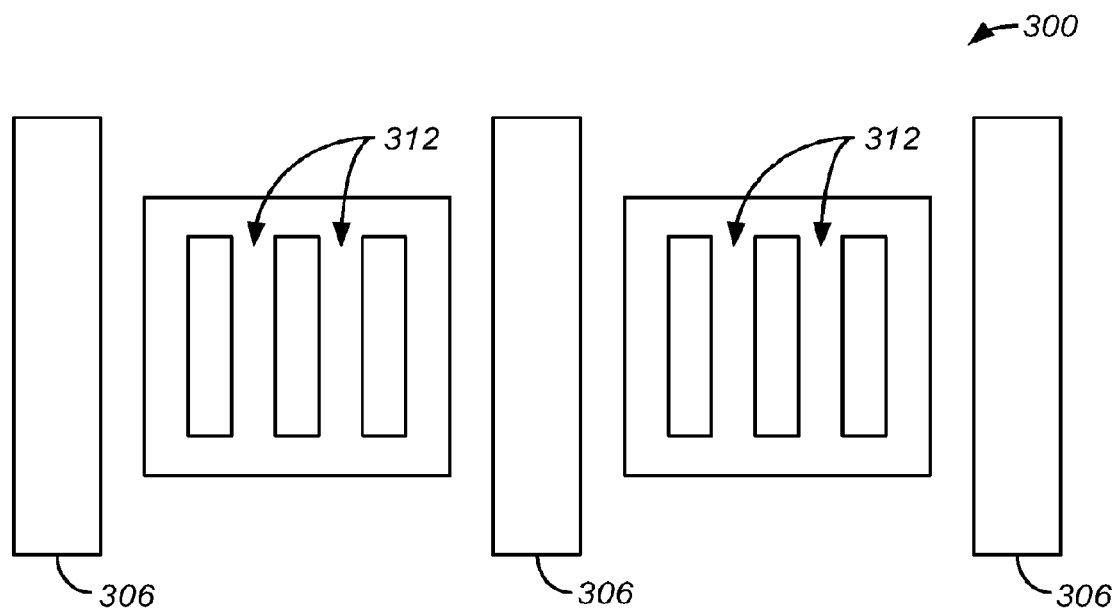
Figure 4:
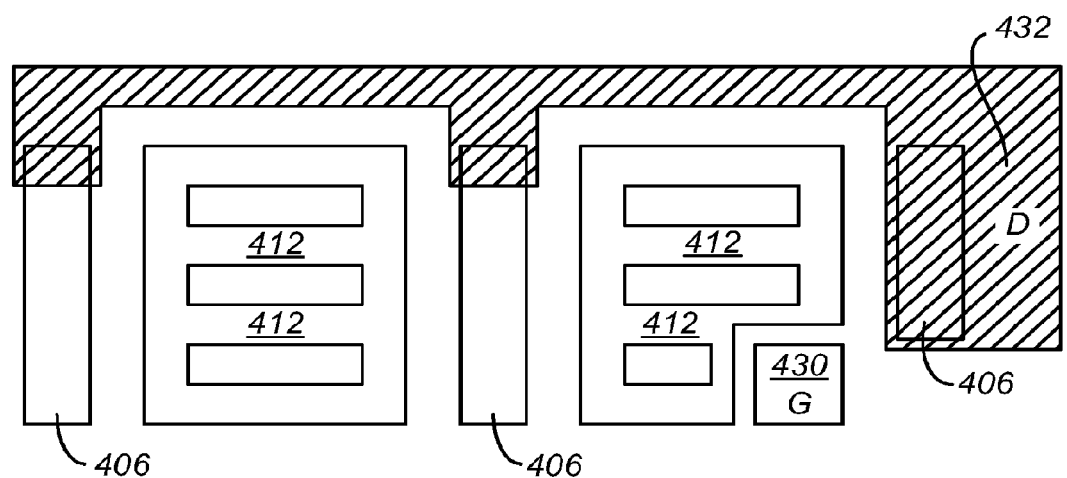

FIG. 2 shows a simplified top layout view of the power device with sinker trench in accordance with an exemplary embodiment of the invention. The FIG. 2 layout view depicts a stripe-shaped cell configuration. Stripe-shaped gate trenches 212a extend vertically and terminate in horizontally-extending gate trenches 212b. As shown, the three groups of striped gate trenches are surrounded by a contiguous sinker trench 206. In an alternate embodiment shown in FIG. 3, sinker trenches 306 are disposed between groups of gate trenches (only two of which are shown) and are repeated at such frequency and spacing as dictated by the desired Ron. In one variation of this embodiment, to achieve the same Ron as the back-side drain contact approach, the spacing between adjacent sinker trenches needs to be two times the thickness of the wafer. For example, for a 4 mils thick wafer, the sinker trenches may be spaced from one another by approximately 8 mils. For even a lower Ron, the sinker trenches may be placed closer together. In yet another embodiment shown in FIG. 4, striped gate trenches 412 extend horizontally, and vertically extending sinker trenches 406 separate the different groups of gate trenches. Sinker trenches 406 are interconnected by a metal interconnect 432. Metal interconnect is shown as being enlarged along the right side of the figure forming a drain pad for bond-wire connection. Also a gate pad 430 is shown in a cut-out corner of one of the groups of gate trenches.

Figure 5:
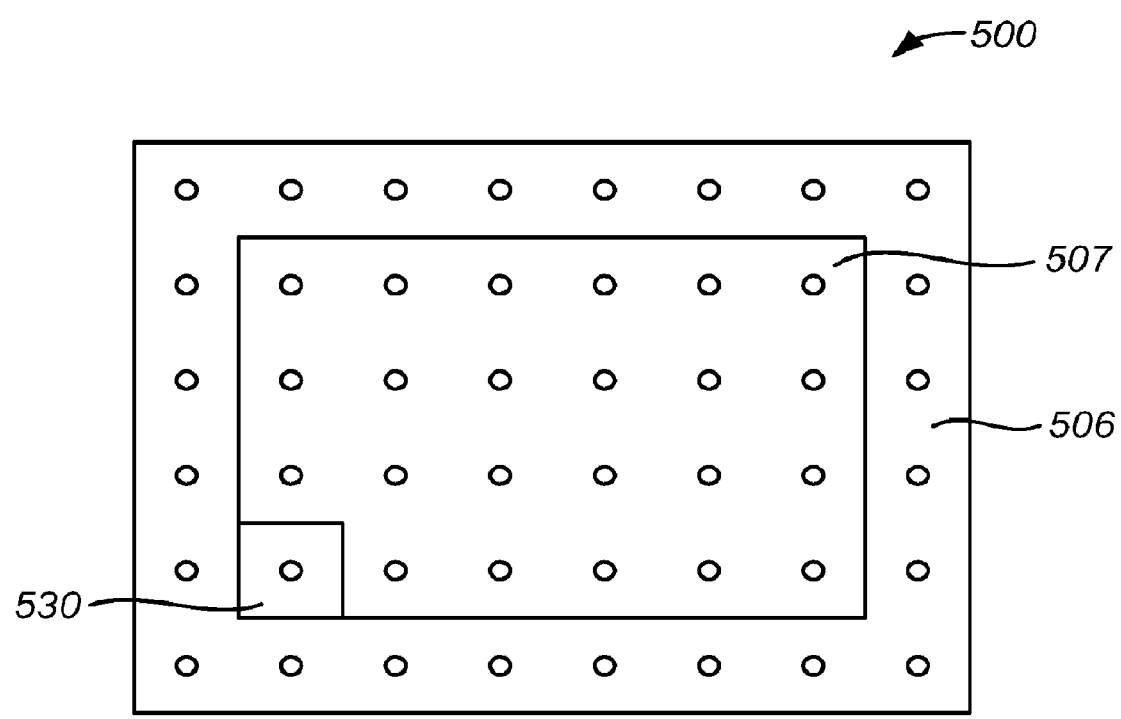
FIG. 5 is a top view illustrating the locations of interconnect balls in a ball-grid array package relative to a sinker trench extending along the perimeter of a die housed in the ball-grid array package, in accordance with an exemplary embodiment of the invention.

FIG. 5 shows a top view of a die housing the power device with sinker trenches in accordance with an embodiment of the invention. The small circles depict the balls of a ball grid array package. The outer perimeter region 506 includes the sinker trench, and the balls in outer periphery region 506 thus provide the drain connection. Central region 507 represents the active region and the balls inside this region provide the source connection. The small square region 530 at the bottom left corner of central region 508 represents the gate pad and the ball inside region 530 provides the gate connection.

As is readily apparent, the sinker trench structure 106 in FIG. 1 may be used to bring the backside connection of any power device to the top surface and as such is not limited to use with vertical trenched-gate power MOSFETs. Same or similar sinker trench structures may be similarly integrated with such other vertically conducting power devices as planar gate MOSFETs (i.e., MOSFETs with the gate and its underlying channel region extending over and parallel to the silicon surface), and power diodes to make the anode or cathode contact regions available along the top for interconnection. Many other variations and alternatives are possible, including use of shielded gate and dual gate structures in different combinations with various charge balancing techniques many of which are described in detail in the above-referenced commonly assigned patent application Ser. No. 11/026,276 titled "Power Semiconductor Devices and Methods of Manufacture" filed Dec. 29, 2004, which is incorporated herein by reference in its entirety. Also, although FIGS. 2-5 show layout implementations based on the open cell configuration, the invention is not limited as such. The structure shown in FIG. 1 can also be implemented in any one of a number of well known closed cell configurations. Lastly, the dimensions in the cross section view in FIG. 1 and the top layout views in FIGS. 2-5 are not to scale and are merely illustrative.

What is claimed is:

1. A semiconductor power device comprising:
    a plurality of groups of stripe-shaped trenches extending in a silicon region over a substrate;
    a contiguous sinker trench completely surrounding each group of the plurality of stripe-shaped trenches so as to isolate the plurality of groups of stripe-shaped trenches from one another, the contiguous sinker trench extending from a top surface of the silicon region through the silicon region and terminating with in the substrate, the contiguous sinker trench being wider and extending deeper than the plurality of stripe-shape trenches, the contiguous sinker trench being lined with an insulator only along the sinker trench sidewalls so that a conductive material filling the contiguous sinker trench makes electrical contact with the substrate along the bottom of the contiguous sinker trench and makes electrical contact with an interconnect layer along the top of the contiguous sinker trench.

2. The semiconductor power device of claim 1 wherein the silicon region is an epitaxial layer and the plurality of stripe-shape trenches are gate trenches, the semiconductor device further comprising:
    a well region of a second conductivity type in the epitaxial layer;
    source regions of the first conductivity type in the well region, the source regions flanking the gate trenches;
    a gate dielectric layer lining at least the sidewalls of each gate trench; and
    a gate electrode at least partially filling each gate trench,
    wherein a gate electrode contact layer electrically contacting the gate electrodes, a source contact layer electrically contacting the source regions, and a drain contact layer electrically contacting the substrate are all along one surface of the semiconductor power device.

3. The semiconductor power device of claim 1 wherein the conductive material includes one or more of doped polysilicon, selective epitaxial silicon (SEG), metal, and metallic compound.

4. The semiconductor power device of claim 1 wherein the insulator comprises one of oxide, silicon nitride, silicon oxynitride, multilayer of oxide and nitride, a low k insulating material, and a high k insulating material.

5. The semiconductor power device of claim 1 wherein two of the plurality of groups of strip-shaped trenches include different number of strip-shaped trenches.

6. The semiconductor power device of claim 1 further comprising a back-side metal layer extending along a bottom surface of the substrate.

7. The semiconductor power device of claim 1 wherein the conductive material comprises polysilicon and a ratio of a width of the sinker trench to a width of each gate trench is less than five to one.

8. The semiconductor power device of claim 1 wherein the conductive material comprises a metal and a ratio of a width of the sinker trench to a width of each gate trench is less than three to one.

9. The semiconductor power device of claim 2 wherein the dielectric layer lining the sidewalls of the contiguous sinker trench is thicker than the gate dielectric layer.

10. The semiconductor power device of claim 2 wherein the dielectric layer lining the sidewalls of the contiguous sinker trench and the gate dielectric layer have the same thickness.

11. The semiconductor power device of claim 2 wherein each gate trench further includes a thick bottom dielectric below the gate electrode, the thick bottom dielectric having a greater thickness than that of the gate dielectric.

12. The semiconductor power device of claim 1 wherein each gate trench includes a shield electrode below the gate electrode, the gate and shield electrodes being insulated from one another.

* * * * *